United States Patent
Iseki et al.

(10) Patent No.: US 7,833,626 B2
(45) Date of Patent: Nov. 16, 2010

(54) AMORPHOUS CARBON FILM, PROCESS FOR FORMING THE SAME, AND HIGH WEAR-RESISTANT SLIDING MEMBER WITH AMORPHOUS CARBON FILM PROVIDED

(75) Inventors: Takashi Iseki, Nisshin (JP); Hideo Tachikawa, Nisshin (JP); Hiroyuki Mori, Nisshin (JP); Kazuyuki Nakanishi, Seto (JP); Munehisa Matsui, Toyota (JP); Shintaro Igarashi, Toyota (JP); Fumio Shimizu, Toyota (JP); Yoshinari Tsuchiya, Kasugai (JP); Tadashi Oshima, Aichi-ken (JP)

(73) Assignee: Kabushiki Kaisha Toyota Chuo Kenkyusho, Aichi-gun (JP)

( * ) Notice: Subject to any disclaimer, the term of this patent is extended or adjusted under 35 U.S.C. 154(b) by 410 days.

(21) Appl. No.: 11/720,154

(22) PCT Filed: Nov. 24, 2005

(86) PCT No.: PCT/JP2005/022044

§ 371 (c)(1),
(2), (4) Date: Nov. 19, 2007

(87) PCT Pub. No.: WO2006/057436

PCT Pub. Date: Jun. 1, 2006

(65) Prior Publication Data
US 2008/0188383 A1    Aug. 7, 2008

(30) Foreign Application Priority Data
Nov. 25, 2004    (JP)    ............................. 2004-340846

(51) Int. Cl.
*B32B 9/00*    (2006.01)
*H05H 1/24*    (2006.01)

(52) U.S. Cl. ........................ 428/408; 428/446; 428/688; 428/689; 427/577; 508/109

(58) Field of Classification Search ................. 428/688, 428/689, 411.1, 408; 427/577; 508/100, 508/107, 109
See application file for complete search history.

(56) References Cited

U.S. PATENT DOCUMENTS 5,266,398 A    11/1993  Hioki et al.

(Continued)

FOREIGN PATENT DOCUMENTS

EP    0 874 066    10/1998

(Continued)

OTHER PUBLICATIONS

J. Robertson, Diamond-like amorphous carbon, No Month 2002, Materials Science and Engineering R, 37, p. 129-281.*

(Continued)

*Primary Examiner*—Timothy M Speer
(74) *Attorney, Agent, or Firm*—Oblon, Spivak, McClelland, Maier & Neustadt, L.L.P.

(57) ABSTRACT

An amorphous carbon film includes carbon as a major component, and silicon in an amount of from 0.1 atomic % or more to 10 atomic % or less when the entire amorphous carbon film is taken as 100 atomic %. The carbon is composed of carbon having an $sp_2$ hybrid orbital in an amount of from 60 atomic % or more to 90 atomic % or less when the entire carbon amount is taken as 100 atomic %. Also disclosed is a process for producing the amorphous carbon film.

20 Claims, 2 Drawing Sheets

U.S. PATENT DOCUMENTS

| | | | | |
|---|---|---|---|---|
| 5,771,873 | A | * | 6/1998 | Potter et al. .................. 123/668 |
| 7,537,835 | B2 | * | 5/2009 | Mori et al. .................. 428/408 |

FOREIGN PATENT DOCUMENTS

| | | | |
|---|---|---|---|
| EP | 1 486 695 | | 12/2004 |
| JP | 3 240957 | | 10/1991 |
| JP | 7 54150 | | 2/1995 |
| JP | 2003 293136 | | 10/2003 |
| WO | WO 03029685 | * | 4/2003 |

OTHER PUBLICATIONS

Papakonstantinou, et al., The effects of Si incorporation on the electrochemical and nanomechanical properties of DLC thin films, Diamond and Related Materials, 11, 2002, p. 1074-1080.*

U.S. Appl. No. 12/300,179, filed Nov. 10, 2008, Iseki et al.

G. A. Abbas, et al., "A Study of ta-C, a-C:H and Si-a:C:H Thin Films on Polymer Substrates as a Gas Barrier", Diamond and Related Materials, vol. 13, No. 4-8, XP 004507971, pp. 1342-1345, 2004.

P. Papakonstantinou, et al., " The Effects of Si Incorporation on the Electrochemical and Nanomechanical Properties of DLC Thin Films", Diamond and Related Materials, vol. 11, No. 3-6, XP 004357078, pp. 1074-1080, 2002.

* cited by examiner

AMORPHOUS CARBON FILM, PROCESS FOR FORMING THE SAME, AND HIGH WEAR-RESISTANT SLIDING MEMBER WITH AMORPHOUS CARBON FILM PROVIDED

CROSS REFERENCE TO RELATED APPLICATION

This application is a 371 of PCT/JP05/022044, filed on Nov. 24, 2005, and claims priority to Japanese Patent Application No. 2004-340846, filed on Nov. 25, 2004.

TECHNICAL FIELD

The present invention relates to an amorphous carbon film whose major component is carbon, a process for forming the same, and a high wear-resistant sliding member with an amorphous carbon film provided.

BACKGROUND ART

Sliding members, such as pistons and valve-system component parts making engines, have been subjected to various surface treatments in order to suppress wear or seizure. In particular, an amorphous carbon film, a so-called diamond-like carbon film (hereinafter abbreviated to as "DLC" wherever appropriate), has been used widely as a film for enhancing the sliding members' sliding ability, because it is good in terms of mechanical characteristics, such as wear resistance and solid lubricating property. Moreover, various studies have been done on the film compositions of amorphous carbon film and the processes for producing the same in order to furthermore upgrade the mechanical characteristics of amorphous carbon film. For example, Japanese Unexamined Patent Publication (KOKAI) No. 3-240, 957 discloses an amorphous carbon film containing silicon, and a process for producing the same. Moreover, Japanese Unexamined Patent Publication (KOKAI) No. 7-54,150 discloses an amorphous carbon film containing silicon and nitrogen, and a process for producing the same.

For example, automotive engines' sliding parts might be exposed to considerably high pressures. Accordingly, an amorphous carbon film is required to exhibit high wear resistance. However, in Japanese Unexamined Patent Publication (KOKAI) No. 3-240, 957 and Japanese Unexamined Patent Publication (KOKAI) No. 7-54,150, the amorphous carbon films are only examined for the wear characteristics under such low-load sliding conditions as from 5 to 6 N. Moreover, the conventional amorphous carbon films disclosed in the two publications exhibited a wear amount of from 0.2 to 0.3 μm, respectively, even under the low-load sliding conditions. That is, the conventional amorphous carbon films exhibited a large wear amount, respectively, despite the low-load sliding conditions. Thus, it is not possible to say that the conventional amorphous carbon films' wear resistance is satisfactory.

Moreover, from the viewpoint of durability, there might arise cases where it is desirable to thicken the film thickness of amorphous carbon film. Note herein that the conventional amorphous carbon films, disclosed in Japanese Unexamined Patent Publication (KOKAI) No. 3-240,957 and Japanese Unexamined Patent Publication (KOKAI) No. 7-54,150, exhibited a high hardness, respectively. A high-hardness amorphous carbon film usually exhibits a high elastic modulus. Accordingly, when thickening the film thickness of high-hardness amorphous film, the internal stress of high-hardness amorphous carbon film enlarges so that the thickened high-hardness amorphous carbon film is likely to peel from a substrate or even break up. Consequently, it has been difficult to thicken the conventional amorphous carbon films to a thickness of 10 μm or more.

DISCLOSURE OF THE INVENTION

The present invention has been developed in view of such circumstances. It is therefore an object of the present invention to provide an amorphous carbon film whose film thickness is enlargeable, and which is good in term of the wear resistance. Moreover, it is another object of the present invention to provide a process for forming such an amorphous carbon film, and a high wear-resistant sliding member with such an amorphous carbon film provided.

(1) There are three types of carbon atom, carbon having an sp hybrid orbital (or Csp), carbon having an $sp^2$ hybrid orbital (or $Csp^2$), and carbon having an $sp^3$ hybrid orbital (or $Csp^3$). For example, diamond is composed of $Csp^3$ only. Specifically, diamond has such a structure that the neighboring carbon atoms are covalent bonded by means of $sp^3$ hybrid orbital in four directions, that is, in directions heading toward the respective apexes of a regular tetrahedron from the center thereof, and the four carbon atoms covalent bonded like a tetrahedron are disposed one after another three-dimensionally. On the other hand, graphite is composed of $Csp^2$ only. Specifically, graphite has such a structure that the neighboring carbon atoms are covalent bonded by means of $sp^2$ hybrid orbital in three directions in an identical plane to form a six-membered carbon ring layer, and the resulting six-membered carbon ring layers are laminated. In the present specification, carbon which makes an $sp^2$ hybrid orbital to bond will be hereinafter referred to as "carbon having an $sp^2$ hybrid orbital," or simply "$Csp^2$." Likewise, carbon which makes an $sp^3$ hybrid orbital to bond will be hereinafter referred to as "carbon having an $sp^3$ hybrid orbital," or simply "$Csp^3$."

In general, it is said that diamond composed of $Csp^3$ only exhibits higher wear resistance than graphite composed of $Csp^2$ only does. Graphite has carbon-carbon double bonds (or C═C bonds) by means of $Csp^2$ in the six-membered carbon ring layers. The common knowledge seems to be contradictory regarding the wear resistance, because the C═C bond is stronger than the carbon-carbon single bond (or C—C bond) by means of $Csp^3$ is. However, note that the six-membered carbon ring layers of graphite are bonded by means of van der Waals force. Accordingly, the bonds between the six-membered carbon ring layers are weak so that the six-membered carbon ring layers are likely to peel from each other. Consequently, graphite is likely to wear off, though graphite is good in terms of the lubricating property because of the sliding between the six-membered carbon ring layers.

The present inventors studied earnestly on amorphous carbon films whose major component is carbon over and over again. As a result, they acquired the following novel knowledge: it is possible to achieve improving the wear resistance of amorphous carbon film and thickening amorphous carbon film by adding silicon to amorphous carbon and controlling the content proportion of $Csp^2$. Specifically, amorphous carbon according to the present invention comprises:

carbon as a major component, the carbon composed of carbon having an $sp^2$ hybrid orbital in an amount of from 60 atomic % or more to 90 atomic % or less when the entire carbon amount is taken as 100 atomic %; and silicon in an amount of from 0.1 atomic % or more to 10 atomic % or less when the entire amorphous carbon film is taken as 100 atomic %.

It is believed that two types of carbon, $Csp^2$ and $Csp^3$, make the present amorphous carbon film. In the present amorphous carbon film, $Csp^2$ occupies the entire carbon in a greater proportion. Moreover, the present amorphous carbon film comprises silicon (Si) Silicon makes a three-dimensional $sp^3$ hybrid orbital to bond. Accordingly, in the present amorphous carbon, the six-membered carbon ring layers composed of $Csp^2$ make covalent bonds with silicon and carbon having a three-dimensional $sp^3$ hybrid orbital. That is, the present amorphous carbon film has such a structure that the six-membered carbon ring layers having firm C=C bonds are bonded three-dimensionally while $Csp^3$ and Si intervene between the six-membered carbon ring layers. Consequently, the present amorphous carbon film exhibits high wear resistance while maintaining the lubricating property.

Moreover, when the proportion of $Csp^3$ is great, the internal stress of the resulting amorphous carbon film is believed to enlarge because carbon atoms settle in improper atomic positions to cause strain. On the other hand, the present amorphous carbon film comprises $Csp^2$ in a greater proportion, and comprises $Csp^3$ in a lesser proportion. Accordingly, the C—C bonds are strained less so that the internal stress of the present amorphous carbon film is small. Consequently, even when the thickness of the present amorphous carbon film is enlarged, the present amorphous carbon film is less likely to peel from a substrate or break up. Specifically, it is possible to thicken the present amorphous carbon film to a thickness of 10 μm or more.

In addition, according to analyses carried out by the present inventors, silanol (i.e., SiOH) is formed on a surface of the present amorphous carbon film when it slides on a mating member, because the amorphous carbon film comprises silicon. Silanol is believed to absorb water in a sliding atmosphere to lower the shearing force exerted between sliding members. Consequently, the present amorphous carbon film exhibits a low friction coefficient, which results from the good lubricating property.

(2) The present amorphous carbon film can be formed by a film-forming process according to the present invention as hereinafter described, for example. Specifically, a process according to the present invention for forming an amorphous carbon comprises:

disposing a substrate in a reactor chamber;

introducing a reaction gas into the reactor chamber, the reaction gas comprising:

at least one member selected from the group consisting of hydrocarbon gases including carbon having an $sp^2$ hybrid orbital, and hydrocarbon gases decomposed by electric discharge to generate carbon having an $sp^2$ hybrid orbital; and a silicon compound gas; and electrically discharge the reaction gas.

The present process uses at least one member selected from the group consisting of hydrocarbon gases including carbon having an $sp^2$ hybrid orbital and hydrocarbon gases decomposed by electric discharge to generate carbon having an $sp^2$ hybrid orbital, as a component of the reaction gas, which makes a raw material for the present amorphous carbon film. Accordingly, the proportion of $Csp^2$ enlarges in the formed amorphous carbon film. Moreover, when the proportion of $Csp^2$ is great, the internal stress of amorphous carbon film is less so that, even if the amorphous carbon film has a heavy thickness, it is possible to form such an amorphous film without being peeled from a substrate. Consequently, the present process can form heavy-thickness amorphous carbon films whose thickness is 10 μm or more.

(3) A high wear-resistant sliding member according to the present invention comprise:

a substrate; and an amorphous carbon film formed on a part of a surface of the substrate at least, the amorphous carbon film comprising:

carbon as a major component, the carbon composed of carbon having an $sp^2$ hybrid orbital in an amount of from 60 atomic % or more to 90 atomic % or less when the entire carbon amount is taken as 100 atomic %; and silicon in an amount of from 0.1 atomic % or more to 10 atomic % or less when the entire amorphous carbon film is taken as 100 atomic %.

The present high wear-resistant sliding member is provided with the above-described present amorphous carbon film. That is, the present amorphous carbon film makes a sliding surface of the present high wear-resistant sliding member. Accordingly, the present high wear-resistant sliding member exhibits high wear resistance, and a low friction coefficient. Moreover, as described above, it is possible to thicken the present amorphous carbon film. Consequently, it is possible to furthermore upgrade the durability of the present high wear-resistant sliding member by forming the heavy-thickness present amorphous carbon film.

As described above, the present amorphous carbon film not only comprises carbon, but also comprises silicon. The $Csp_2$ in the present amorphous carbon film is in a greater proportion of the entire carbon. Accordingly, the six-membered carbon ring layers composed of $Csp^2$ make covalent bonds with the carbon having an $sp^3$ hybrid orbital and silicon to form a three-dimensional structure. Consequently, the present amorphous carbon film exhibits high wear resistance while maintaining the lubricating property. Moreover, it is possible to thicken the present amorphous carbon film because the present amorphous carbon film suffers less from the internal stress. The present process for forming an amorphous carbon film can produce the present amorphous carbon film at a practical film-forming rate with ease. In addition, the present high wear-resistant sliding member exhibits high wear resistance and a low friction coefficient, and is good in terms of the durability.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

BEST MODE FOR CARRYING OUT THE INVENTION

Figure 1:
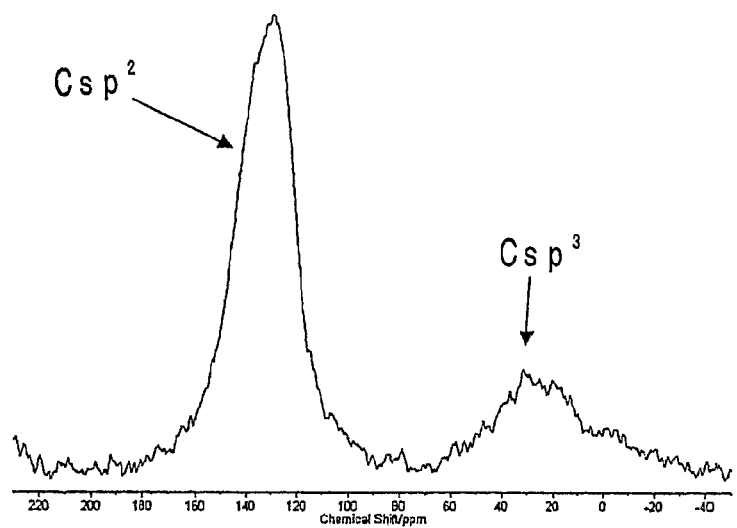
FIG. 1 illustrates an NMR chart of $^{13}C$ NMR spectrum on an amorphous carbon film according to an example of the present invention.

The present invention will be hereinafter described in detail with reference to embodiment modes. The present amorphous film, and the present process for forming the same will be described below. Note that it is possible to select or combine the descriptions appropriately to apply them to the present high wear-resistant sliding member.

Amorphous Carbon Film

The amorphous carbon film comprises carbon as a major component, and silicon in an amount of from 0.1 atomic % or more to 10 atomic % or less when the entire amorphous carbon film is taken as 100 atomic %. The carbon is composed of carbon having an $sp^2$ hybrid orbital in an amount of from 60 atomic % or more to 90 atomic % or less when the entire carbon amount is taken as 100 atomic %.

As a method for analyzing the $Csp^2$ and $Csp^3$ quantitatively, it is possible to name a Raman scattering spectroscopic method, an infrared spectroscopic method (e.g. Fourie transformation infrared ray (FT-IR) spectroscopy), and an X-ray photoelectron spectroscopic (XPS) method. For example, a method which uses Raman scattering spectroscopy using a visible-light source has been introduced. The method determines a quantitative ratio of the $Csp^2$ and $Csp^3$ from an intensity ratio "I(D)/I(G)," a ratio of the D band at around 1,350 $cm^{-1}$ with respect to the G band at around 1,580 $cm^{-1}$. However, according to a recent study ("MATERIALS SCIENCE & ENGINEERING R-REPORTS 37 (4-6) P. 129 2002), it has been found that, at the D band, the sensitivity of the $Csp^3$ is less than the sensitivity of the $Csp^2$ by a factor of from 1/50 to 1/260. Accordingly, it is not possible to discuss the $Csp^3$ content using Raman scattering spectroscopy. Whereas, using FT-IR spectroscopy, it is possible to evaluate the C—H bond at around 2,900 $cm^{-1}$ qualitatively. However, according to a general interpretation (APPLIED PHYSICS LETTERS 60 p. 2089 1992), it is not possible to quantify the $Csp^2$ and $Csp^3$. On the contrary, using XPS, it is not always impossible to determine a provisional quantitative ratio of the $Csp^2$ and $Csp^3$ by separating the peaks of C═C bond and C—C bond from the bond energy of $C_{1s}$. However, the difference between the bond energies of C═C bond and C—C bond is small, and the peaks of C═C bond and C—C bond often appear as mono-modal peaks. Consequently, it is inevitable that the peak separation is carried out arbitrarily. Moreover, the analyzable range by XPS is limited to a depth of a few nm approximately from the outermost surface of samples from which photoelectrons can escape. The structure of outermost surface differs from the inner structure, because the outermost surface is likely to be affected by unbonded species or oxidation. Accordingly, it is greatly problematic to identify the structure of entire film with the structure of outermost surface. In order to know the inner structure of film, a method is available in which XPS spectra are obtained in situ while carrying out a sputtering treatment with argon ion. However, even using this method, it is not necessarily possible to grasp the true form of film, because the ion bombardment has degenerated the inner structure of film.

Thus, using the aforementioned methods, it is not possible to quantitatively analyze the $Csp^2$ and $Csp^3$ accurately. Therefore, in the present invention, a nuclear magnetic resonance (NMR) method is used, NMR method which is of highest quantitativeness in the structural identification of many organic materials. For example, a high-powered decoupling method, one of solid-state NMR methods, which performs magic angle spinning with quantitativeness (hereinafter abbreviated to as "HD-MAS" wherever appropriate), is used to measure the $Csp^2$ and $Csp^3$ contents. FIG. 1 illustrates an NMR chart of $^{13}C$ NMR spectrum on an amorphous carbon film according to an example of the present invention. As shown in FIG. 1, well-separated peaks, which result from the $Csp^2$ and $Csp^3$, can be observed at around 130 ppm and 300 ppm, respectively. Areas, which are demarcated by the peaks and base line, are determined. Then, the content proportions of the $Csp^2$ and $Csp^3$ with respect to entire carbon content are calculated from a ratio between the resulting areas.

When the $Csp^2$ content is thus calculated, the present amorphous carbon film comprises the $Csp^2$ in an amount of from 60 atomic % or more to 90 atomic % or less when the entire carbon content is taken as 100 atomic %. When the $Csp^2$ content is less than 60atomic %, the firm C═C bond is less so that the wear resistance of the resulting amorphous carbon film lowers. The present amorphous carbon film can preferably comprise the $Csp^2$ in an amount of from 65 atomic % or more, further preferably 70 atomic % or more when the entire carbon content is taken as 100 atomic %. On the other hand, when the $Csp^2$ content is more 90 atomic %, the lamination of the six-membered carbon ring layers develops to form powdery amorphous carbon so that the resulting amorphous carbon film hardly becomes dense. The present amorphous carbon film can preferably comprise the $Csp^2$ in an amount of from 85 atomic % or less, further preferably 80 atomic % or less when the entire carbon content is taken as 100 atomic %. Note that it is believed that the carbon making the present amorphous carbon film is composed of the two types of carbon, the $Csp^2$ and $Csp^3$. Therefore, the present amorphous carbon film comprises the $Csp^3$ in an amount of from 10atomic % or more to 40 atomic % or less, preferably from 15 atomic % or more to 35atomic % or less, further preferably from 20 atomic % or more to 30 atomic % or less, when the entire carbon content is taken as 100 atomic %.

The present amorphous carbon film comprises silicon (Si) in an amount of from 0.1 atomic % or more to 10 atomic % or less when the entire amorphous carbon film is taken as 100 atomic %. When the Si content is less than 0.1 atomic %, the advantages of the present invention, the upgrading of amorphous carbon film's wear resistance and the reduction of amorphous carbon film's friction coefficient, are effected less. The present amorphous carbon film can preferably comprise Si in an amount of 1 atomic % or more, further preferably 2 atomic % or more, furthermore preferably 3 atomic % or more, when the entire amorphous carbon film is taken as 100 atomic %. On the other hand, when the Si content is more than 10 atomic %, the wear resistance of the resulting amorphous carbon film lowers. The present amorphous carbon film can preferably comprise Si in an amount of 7 atomic % or less, further preferably 5 atomic % or less, furthermore preferably 4 atomic % or less, when the entire amorphous carbon film is taken as 100 atomic %.

In addition to carbon and silicon, the present amorphous carbon film can preferably further comprise hydrogen in an amount of from 10 atomic % or more to 30 atomic % or less when the entire amorphous carbon film is taken as 100 atomic %. When the hydrogen content is less than 10 atomic %, the hardness of the resulting amorphous carbon film enlarges so that the adhesion to substrates and the toughness lower. The present amorphous carbon film can preferably comprise hydrogen in an amount of 15 atomic % or more, further preferably 17 atomic % or more, furthermore preferably 20 atomic % or more, when the entire amorphous carbon film is taken as 100 atomic %. On the other hand, when the hydrogen content is more than 30 atomic %, the molecules making the resulting amorphous carbon film are terminated by the C—H bond so that the wear resistance of the resulting amorphous carbon film lowers, in addition to the fact that the resulting amorphous carbon film exhibits a lowered hardness. The present amorphous carbon film can preferably comprise hydrogen in an amount of less than 30 atomic %, further preferably 25 atomic % or less, furthermore preferably 22 atomic % or less, when the entire amorphous carbon film is taken as 100 atomic %. When the present amorphous carbon film thus comprises carbon composed of less $Csp^3$, and less hydrogen, the molecules making the present amorphous carbon film are less likely to be terminated by the C—H bond. As a result, the present amorphous carbon is believed to be less likely to wear off.

The hardness of the present amorphous carbon film is not limited in particular. However, the present amorphous carbon film can preferably exhibit a hardness of 10 GPa or more, further preferably from 10 GPa or more to 20 GPa or less, furthermore preferably from 12 GPa or more to 18 GPa or less. Note that, in the present invention, values measured with Ttriboscope (produced by HYSITRON Corp.) are employed as the hardness of amorphous carbon films. Moreover, the present amorphous carbon film can preferably have a film thickness of from 0.05 µm or more to 50 µm or less, further preferably from 0.5 µm or more to 20 µm or less, furthermore preferably from 1 µm or more to 15 µm or less. For example, when the present amorphous carbon film is coated on component parts, such as pistons, which are used in sliding environments exerting high sliding pressures, the present amorphous carbon film can preferably have a heavy film thickness in view of the durability. In such an instance, the present amorphous carbon film can preferably have a film thickness of 5 µm or more, preferably 10 µm or more. On the other hand, when present amorphous carbon film is coated on tools, such as machining drills and taps, the present amorphous carbon film can preferably have a film thickness of from 0.05 µm or more to 1.0 µm or less in order make the coated present amorphous carbon film less likely to peel.

Process for Forming Amorphous Carbon Film

The present amorphous carbon film can be formed by already known chemical vapor deposition (or CVD) processes or physical vapor deposition (or PVD) processes, such as plasma CVD processes, ion plating processes and sputtering processes. However, the film formation exhibits directivity in PVD processes, as represented by sputtering processes. Accordingly, it is needed to dispose a plurality of targets in a film-forming apparatus, or to rotate a substrate which is subjected to film forming. As a result, the structure of film-forming apparatus gets complicated to raise the manufacturing cost. Moreover, in PVD processes, it might be difficult to carry out film forming, depending on the shape of substrate. On the contrary, in plasma CVD processes, it is possible to carry out film forming regardless of the shape of substrate, because films are formed using reaction gases. Moreover, in plasma CVD processes, the structure of film-forming apparatus is not only simple but also inexpensive.

When forming the present amorphous carbon film by a plasma CVD process, a substrate can be disposed in a vacuum chamber. Then, a reaction gas and a carrier gas can be introduced into the vacuum chamber. Subsequently, a plasma can be generated by discharging the reaction gas electrically, thereby depositing ionized gas species on the substrate to form the present amorphous carbon film. As for the reaction gas, it is possible to use a mixture gas of a hydrocarbon gas and a silicon compound gas. The hydrocarbon gas can be composed of methane, acetylene, benzene, toluene, xylene, naphthalene, or cyclohexane, for example. The silicon compound gas can be composed of $Si(CH_3)_4$ (hereinafter referred to as "TMS" wherever appropriate), $SiH_4$, $SiCl_4$, or $SiH_2F_4$, for instance. In addition, a carrier gas can be used, carrier gas which is composed of hydrogen or argon.

As for the plasma CVD process, the following are available: a high-frequency plasma CVD process using high-frequency electric discharge; a micro-wave plasma CVD process using micro-wave electric discharge; and a direct-current plasma CVD process using direct-current electric discharge, for example. Among them, it is preferable to use the direct-current plasma CVD process. The direct-current plasma CVD process makes it possible to constitute a film-forming apparatus of a vacuum furnace and a direct-current power source. Accordingly, the resulting film-forming apparatus can carry out film forming onto substrates having various shapes. Moreover, even when a concentration of the reaction gas is raised to increase a film-forming pressure to 100 Pa or more, the direct-current plasma CVD process can produce electric discharge stably.

Hereinafter, the present process for forming an amorphous carbon film will be described as a preferable mode using a plasma CVD process. The present process for forming an amorphous carbon film comprises: disposing a substrate in a reactor chamber; introducing a reaction gas into the reactor chamber, the reaction gas comprising: at least one member selected from the group consisting of hydrocarbon gases including carbon having an $sp^2$ hybrid orbital, and hydrocarbon gases decomposed by electric discharge to generate carbon having an $sp^2$ hybrid orbital; and a silicon compound gas; and electrically discharge the reaction gas. Note that it is possible to grasp the present process as a process for producing the later-described present high wear-resistant sliding member.

As for the substrate, it is possible to use a material selected from the group consisting of metal, ceramic and resin. For example, it is possible to name metallic substrates, ceramic substrates, and resinous substrates. The metallic substrates can be made of carbon steel, alloy steel, cast steel, aluminum alloy, or titanium alloy. The ceramic substrates can be made of cemented carbide, alumina, or silicon nitride. The resinous substrates can be made of polyamide, or polyamide.

Moreover, from the viewpoint of enhancing the adhesion between substrate and amorphous carbon film, it is advisable to subject a surface of a substrate to protrusion-forming treatment by means of ion bombardment in advance. Specifically, such an protrusion-forming treatment can be carried out in the following manner: a substrate is first disposed in a chamber; a gas within the chamber is evacuated to a predetermined gas pressure; a rare gas for forming protrusion is then introduced into the chamber; and ion bombardment is finally carried out by glow discharge or ion beam, thereby forming irregularities on a surface of the substrate. Moreover, in order to form uniform and fine protrusions on a surface of a substrate, it is advisable to subject a surface of a substrate to a nitriding treatment before the protrusion-forming treatment. As the method for nitriding treatment, gas nitriding methods, salt-bath nitriding methods, and ion nitriding methods are available. After subjecting a substrate to such a nitriding treatment, it is further advisable to grind or polish a surface of the substrate to a ten-point average roughness $R_{zJIS}$ of 0.5 µm or less, and thereafter to subject the substrate to the above-described ion bombardment. Note that the ten-point average roughness $R_{zJIS}$ is defined in Japanese Industrial Standard (or JIS) B0601.

As the reaction gas, the following are used: at least one member selected from the group consisting of hydrocarbon gases including $Csp^2$, and hydrocarbons decomposed by electric discharge to generate $Csp^2$; and a silicon compound gas. The hydrocarbon gases including $Csp^2$, in other words, hydrocarbon gases including a hydrocarbon having a carbon-carbon double bond, can preferably be composed of benzene, toluene, xylene, or naphthalene. In particular, the hydrocarbon gas including $Csp^2$ can further preferably be composed of benzene, toluene, xylene, or naphthalene. Moreover, in the direct-current plasma CVD process, it is believed that the reaction gas is less likely to decompose, because the plasma density is low relatively. Accordingly, when the direct-current plasma CVD process uses a hydrocarbon gas whose dissociation energy is low, such as a benzene gas, it is possible to effectively increase the $Csp^2$ content in the present amorphous carbon film.

Hydrocarbons, which are decomposed by electric discharge to generate $Csp^2$, are free from a carbon-carbon double bond when it is put into a hydrocarbon gaseous state. However, the hydrocarbons generate carbon which bonds by means of $sp^2$ hybrid orbital. The hydrocarbons can preferably be composed of methane, propane, or hexane. For example, methane is composed of $Csp^3$, but $Csp^3$ is decomposed by electric discharge to generate $Csp^2$. In the present process for forming an amorphous carbon film, the reaction gas can comprise one of the hydrocarbon gases including $Csp^2$ and the hydrocarbons decomposed by electric discharge to generate $Csp^2$, or a mixture of two or more of them.

The silicon compound gas can preferably be composed of TMS, $SiH_4$, $SiCl_4$, or $SiH_2F_4$, as described above. In particular, the silicon compound gas can preferably be composed of TMS, because TMS is stable chemically in air and can be handled with ease.

Moreover, a carrier gas can be introduced into the reaction chamber, along with the reaction gas. When using a carrier gas, the reaction gas and the carrier gas form an atmosphere for forming an amorphous carbon film. As for the carrier gas, it is advisable to use a hydrogen gas, or an argon gas, as described above. The types and flow-volume ratios of the reaction gas and carrier gas can be controlled appropriately so as to make the composition of the resulting amorphous carbon film a desirable composition. For example, when the reaction gas comprises a benzene gas, as the hydrocarbon gas, and a TMS gas, as the silicon compound gas, the reaction gas can preferably comprise the benzene gas in an amount of from 0.1 to 1,000 by flow volume, and the carrier gas can preferably comprise a hydrogen gas in an amount of from 0.1 to 1,000 by flow volume, or an argon gas in an amount of from 0.1 to 1,000 by flow volume, with respect to a flow volume of the TMS gas taken as 1 by flow volume, respectively. In this instance, the reaction gas can further preferably comprise the benzene gas in an amount of from 1 to 200 by flow volume, and the carrier gas can preferably comprise a hydrogen gas in an amount of from 1 to 200 by flow volume, or an argon gas in an amount of from 1 to 200 by flow volume, with respect to a flow volume of the TMS gas taken as 1 by flow volume, respectively.

In the present process for forming an amorphous carbon film, a pressure of the atmosphere for forming an amorphous carbon film can preferably fall in a range of from 10 Pa or more to 1,300 Pa or less, further preferably from 300 Pa or more to 667 Pa or less. When the film-forming pressure is increased, the concentration of the reaction gas is raised. Accordingly, it is possible to form a heavy-thickness amorphous carbon film at a large film-forming rate, that is, at a practical rate. As described above, in view of producing electric discharge stably even under a high film-forming pressure, it is preferable to employ the direct-current plasma CVD process.

In the present process for forming an amorphous carbon film, a film-forming temperature can be 600° C. or less. When the film-forming temperature is more than 600° C., the resulting amorphous carbon film has some defects on the surface. On the other hand, when the film-forming temperature is too low, the electric discharge has become unstable. Consequently, the film-forming temperature can preferably be 200° C. or more. Note that the film-forming temperature can furthermore preferably fall in a range of from 400° C. or more to 550° C. or less, moreover preferably from 450° C. or more to 500° C. or less.

EXAMPLES

In accordance with above-described embodiment modes, various amorphous carbon films are formed on a surface of various substrates. Then, two sliding tests were carried out in order to evaluate the friction/wear characteristics of the resulting amorphous carbon films. Hereinafter, how the respective tests were carried out, and how the friction/wear characteristics of the resultant amorphous carbon films were evaluated will be described in detail.

Figure 2:
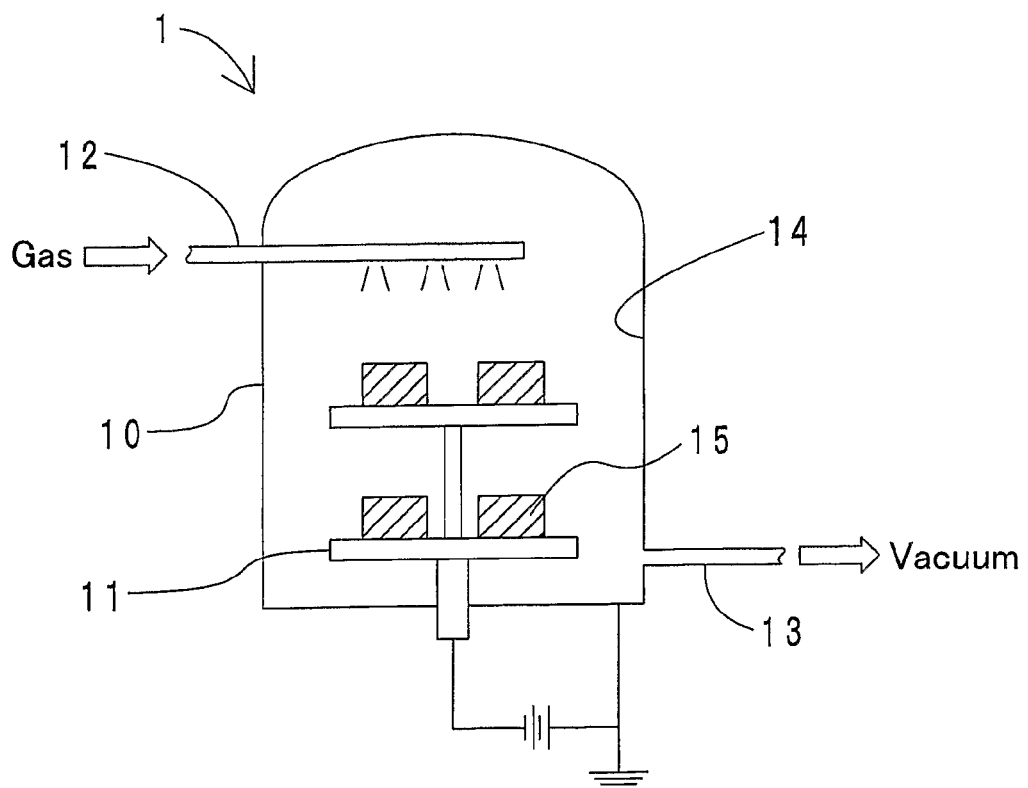
FIG. 2 is a diagram for roughly illustrating a direct-current plasma CVD film-forming apparatus.

(1) Evaluation on Friction/Wear Characteristics by Ball-on-Disk Wear Test (a) Formation of Si-containing Amorphous Carbon Film Using a direct-current film-forming apparatus shown in FIG. 2, an Si-containing amorphous carbon film (hereinafter referred to as "DLC-Si film") was formed on a surface of a substrate. As shown in the drawing, a direct-current film-forming apparatus 1 comprised a chamber 10 made of stainless steel, a bench 11, a gas inlet pipe 12, and a gas outlet pipe 13. Note that the gas inlet pipe 12 was connected with a variety of gas bombs (not shown) by way of valves (not shown). The gas outlet pipe 13 was connected with a rotary pump (not shown) and a diffusion pump (not shown) by way of valves (not shown).

First of all, substrates 15 were placed on the bench 11, which was disposed in the chamber 10. The substrates 15 were disk-shaped test pieces, which were made of martensitic stainless steel, SUS440C as per JIS. The martensitic stainless steel was subjected to quenching and tempering, and exhibited a Rockwell C hardness $H_{RC}$ of from 58 to 60. Note that the disk-shaped test pieces had a diameter of 30 mm and a thickness of 3 mm, and exhibited a ten-point average roughness $R_{zJIS}$ of 0.1 μm. Then, the chamber 10 was sealed, and a gas within the chamber 10 was exhausted using the rotary pump and diffusion pump. Subsequently, a hydrogen gas was introduced into the chamber 10 in a flow volume of 15 sccm (i.e., standard cc/min.) through the gas inlet pipe 12 to increase a gas pressure within the chamber 10 to about 133 Pa. Thereafter, a 200-V direct-current voltage was applied between a positive-electrode plate 14, which are disposed on an inside of the chamber 10, and the bench 11 to start electric discharge. The temperature of the substrates 15 was increased by ion bombardment until the temperature of the substrates 15 reached 500° C. Moreover, a nitrogen gas and a hydrogen gas were introduced into the chamber 10 in a flow volume of 500 sccm and 40 sccm, respectively, in order to carry out a plasma nitriding process for 1 hour under the following conditions: a nitriding pressure was controlled at about 800 Pa; a nitriding voltage was controlled at 400 V; a nitriding current was controlled at 1.5 A; and a nitriding temperature was controlled at 500° C. After the plasma nitriding process, a cross-sectional structure of the substrates 15 was observed to find out that the nitriding depth was 30 μm.

After the plasma nitriding process, a hydrogen gas and an argon gas were introduced into the chamber 10 through the gas inlet pipe 12 in a flow volume of 30 sccm each, in order to carry out sputtering for 1 hour under the following conditions:

a sputtering pressure was controlled at about 533 Pa; a sputtering voltage was controlled at 300 V; a sputtering current was controlled at 1.6 A; and a sputtering temperature was controlled at 500° C. Thus, fine protrusions were formed on the surface of the substrates 15 (i.e., protrusion forming treatment). Note that an average width between the convexes was 60 nm, and an average height of the convexes was 30 nm. Finally, a reaction gas, and further a hydrogen gas and an argon gas were introduced into the chamber 10 through the gas inlet pipe 12 in order to form an amorphous carbon film under the following conditions: a film-forming pressure was controlled at about 533 Pa; a film-forming voltage was controlled at 320 V; a film-forming current was controlled at 1.8 A; and a film-forming temperature was controlled at 500° C. Note that the composition of the reaction gas was changed as set forth in Table 1 below, and the component gases were introduced in a flow volume as set forth in Table 1, respectively. Moreover, the hydrogen gas and the argon gas were introduced in a flow volume of 30 sccm each. In addition, the film-forming time was changed to control the film thickness of the resulting amorphous carbon film.

In accordance with the above-described process, 6 types of DLC-Si films whose film compositions differed with each other were formed on 6 pieces of the disk-shaped test pieces, respectively. The thus formed DLC-Si films were numbered #1 through #6, respectively. Table 1 below summarizes the film-forming conditions (e.g., reaction gas species and flow volumes), the film compositions, and the proportions of $Csp^2$ and $Csp^3$, which occupied with respect to the entire carbon content, for DLC-Si films #1 through #6. Note herein that the present amorphous carbon film includes the DLC-Si films #2 through #6. In the following wear tests, the DLC-Si films formed on the respective disk-shaped substrates made sliding surfaces to mating members.

Moreover, the carbon (C) content and silicon (Si) content in the DLC-Si films were analyzed quantitatively by means of electron probe microanalysis (or EPMA), X-ray photoelectron spectroscopy (XPS), Auger electron spectroscopy (AES), and Rutherford backward scattering spectroscopy (or RBS). In addition, the hydrogen (H) content was analyzed quantitatively by means of elastic recoil detection analysis (or ERDA). The ERDA is a method for measuring a hydrogen concentration in a film by detecting hydrogen ions, which sputter off from the film when the surface of the film is irradiated with 2-MeV helium ion beam, using a semiconductor detector.

TABLE 1

| Sample No. | Reaction Gas (sccm) | | | Film Composition (atomic %) | | | Proportion to Entire Carbon Content (atomic %) | |
|---|---|---|---|---|---|---|---|---|
| | TMS | Methane | Benzene | Si | C | H | $Csp^2$ | $Csp^3$ |
| #1 | 4 | 50 | 0 | 12 | 55 | 33 | 67 | 33 |
| #2 | 1 | 50 | 0 | 5 | 55 | 40 | 64 | 36 |
| #3 | 1 | 100 | 0 | 4 | 66 | 30 | 70 | 30 |
| #4 | 2 | 0 | 10 | 7 | 68 | 25 | 72 | 28 |
| #5 | 2 | 0 | 20 | 3 | 75 | 22 | 75 | 25 |
| #6 | 2 | 0 | 30 | 2 | 75 | 23 | 79 | 21 |

(b) Evaluation on Friction/Wear Characteristics

Figure 3:
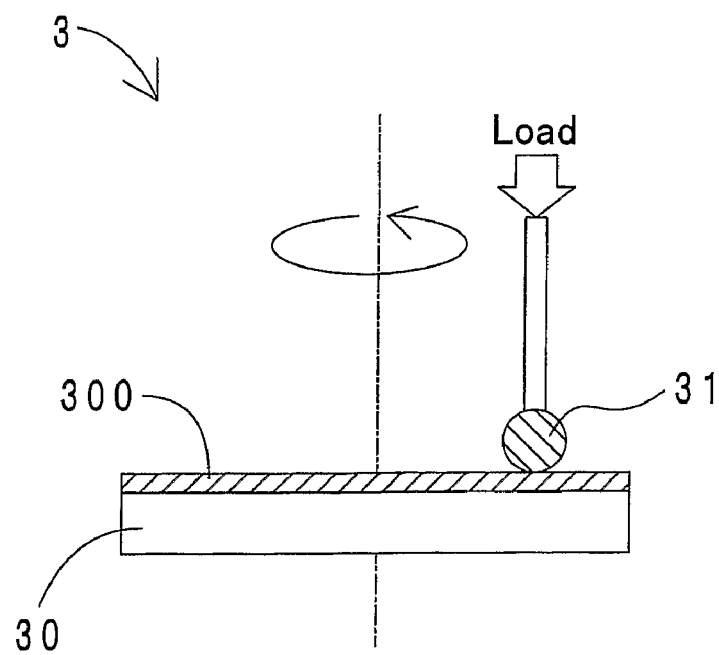
FIG. 3 is a diagram for roughly illustrating a ball-on-disk type wear testing machine.

Using the respective disk-shaped test pieces with the DLC-Si films #1 through #6 formed, a ball-on-disk wear test was carried out. FIG. 3 illustrates a ball-on-disk type wear testing machine roughly. As shown in the drawing, a ball-on-disk wear testing machine 3 comprised a disk-shaped test piece 30, and a ball 31 making a mating member. The disk-shaped test piece 30 and ball 31 were disposed so that a DLC-Si film 300, which was formed on the disk-shaped test piece 30, contacted with the ball 31. Note that the ball 31 had a diameter of 6.35 mm, was made of bearing steel SUJ2 (as per JIS), and exhibited a Vickers hardness Hv of from 750 to 800 and a ten-point average roughness $R_{zJIS}$ of 0.1 µm or less.

First of all, the disk-shaped test piece 30 was rotated without applying a load thereto. Thereafter, a load of 9.8 N was applied to the ball 31 from above. Then, the ball 31 was slid relatively on the disk-shaped test piece 30 by rotating the disk-shaped test piece 30 at a sliding speed of 0.2 m/sec. After sliding the ball 31 relatively on the disk-shaped test piece 30 for 60 minutes, the following friction/wear characteristics were measured: the friction coefficient between the disk-shaped test piece 30 and the ball 31; the maximum wear depth of the disk-shaped test piece 30; and the wear width of the disk-shaped test piece 30. The wear depth herein specifies a depth to a whole test piece with a film coated. Note that an actual pressure of about 1.3 GPa was exerted between the disk-shaped test piece 30 and the ball 31 during the sliding operation.

Table 2 below summarizes the measurement results of the friction coefficients between the respective DLC-Si films and the ball 31, and the maximum wear depths and wear widths of the respective DLC-Si films. Note that a disk-shaped test piece itself, that is, the martensitic stainless steel SUS440C per se, on which no DLC-Si film was formed, was also subjected to the same ball-on-disk wear test as described above. The results are set forth in the line of Table 2 identified with "SUS440C."

TABLE 2

| Sample No. | Film Thickness (µm) | Friction Coefficient | Wear Width (µm) | Maximum Wear Depth (µm) |
|---|---|---|---|---|
| #1 | 3.0 | 0.06 | 338 | 0.7 |
| #2 | 8.0 | 0.05 | 280 | 0.5 |
| #3 | 3.0 | 0.05 | 281 | 0.3 |
| #4 | 2.8 | 0.08 | 273 | 0.2 |
| #5 | 11.4 | 0.05 | 210 | 0.2 |
| #6 | 7.8 | 0.20 | 358 | 0.2 |
| SUS440C | None | 0.60 | 2100 | 25 |

As can be understood from Table 2, although the friction coefficient between the disk-shaped test piece with DLC-Si film #1 formed (hereinafter referred to as "test piece #1") and the ball 31 was low, but the test piece #1 exhibited both wear width and maximum wear depth which had increased. That is, DLC-Si film #1 is poor in terms of the wear resistance. Note that DLC-Si film #1 comprised such a large amount of Si as 12 atomic % with respect to the entire amorphous carbon film taken as 100 atomic %. Accordingly, the proportion of the C—Si bond whose bond energy is as low as 69 kcal/mol was increased so much that DLC-Si film #1 is believed to exhibit a small resisting force to shearing.

On the contrary, in addition to the reduced friction coefficients between test pieces #3 through #5 and the ball 31, test pieces #3 through #5 exhibited both wear widths and maximum wear depths which had decreased. That is, it is appreciated that DLC-Si films #3 through #5 were good in terms of the wear resistance. On the other hand, although test piece #6 exhibited a large wear depth, it exhibited a reduced maximum wear depth. Note that, when comparing DLC-Si film #3 with DLC-Si film #5 whose Si content was substantially identical with that of DLC-Si film #3, DLC-Si film #5 was superior to DLC-Si film #3 in terms of the wear resistance. It is believed that the shear resistance of DLC-Si film #5 was enlarged furthermore by the firm C═C bond whose bond energy is 147 kcal/mol, which existed more abundantly, because the proportion of $Csp^2$ in DLC-Si film #5 was more than that in DLC-Si film #3. From the results on DLC-Si film #5, it is seen that DLC-Si film #5 exhibited high wear resistance, though the film thickness was heavy. On the contrary, DLC-Si film #2 exhibited a slightly increased maximum wear depth. Note that the hydrogen content and the proportion of $Csp^3$ were abundant relatively in DLC-Si film #2. Accordingly, it is believed that DLC-Si film #2 was likely to be worn off, because the C—H bond developed the termination of molecules.

(2) Evaluation on Friction/Wear Characteristics by Ring-on-Block Wear Test (a) Formation of DLC-Si Film Three types of DLC-Si films whose film compositions differed with each other were formed on a block-shaped test piece in the same manner as described in above (1)(a). The block-shaped test piece making a substrate was made of martensitic stainless steel, SUS440C as per JIS. Note that the block-shaped test piece had a height of 6.3 mm, a length of 15.7 mm and a width of 10.1 mm, and exhibited a ten-point average roughness $R_{zJIS}$ of 0.1 μm or less. Note that the film-forming conditions for the resulting DLC-Si films and the film compositions thereof were identical with those of DLC-Si films #1, #3 and #5, which are listed in above Table 1.

(b) Evaluation on Friction/Wear Characteristics

Figure 4:
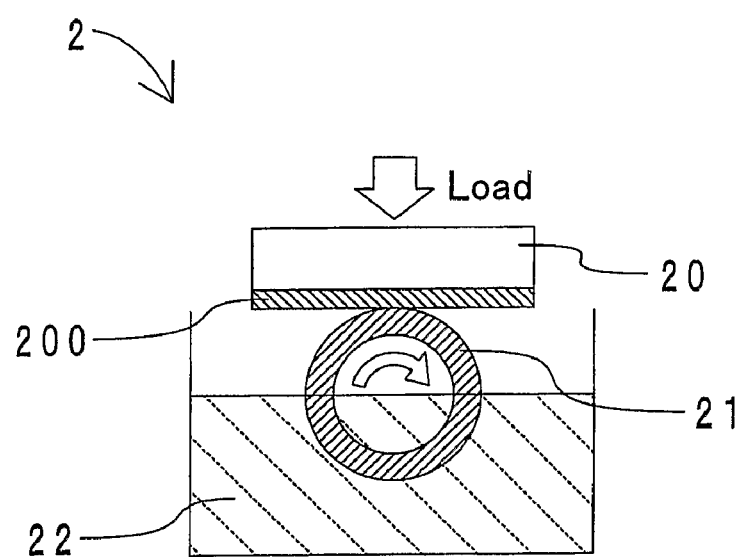
FIG. 4 is a diagram for roughly illustrating a ring-on-block type wear testing machine.

Using the respective block-shaped test pieces with the DLC-Si films formed, a ring-on-block wear test was carried out. FIG. 4 illustrates a ring-on-block type wear testing machine (e.g., "LFW-1" produced by FALEX Corp.) roughly. As shown in the drawing, a ring-on-block wear testing machine 2 comprised a block-shaped test piece 20, and a ring-shaped test piece 21 making a mating member. The block-shaped test piece 20 and ring-shaped test piece 21 were disposed so that a DLC-Si film 200, which was formed on the block-shaped test piece 20, contacted with the ring-shaped test piece 21. The ring-shaped test piece 21 was disposed rotatably in an oil bath 22. In the ring-on-block wear test, an S-10 ring-shaped test piece, a standard test piece for the ring-on-block type testing machine 2, was used as the ring-shaped test piece 21. Note that the S-10 ring-shaped test piece was produced by FALEX Corp., the producer of the ring-on-block type wear testing machine 2, and was made of carburized steel SAE4620. Moreover, the S-10 ring-shaped test piece had a diameter of ϕ 35 mm and a width of 8.8 mm, and exhibited a ten-point average roughness $R_{zJIS}$ of from 1.5 to 2.0 g m. In addition, the oil bath 22 held an engine oil 5W-30, which was heated to and held at 80° C., therein.

First of all, the ring-shaped test piece 21 was rotated without applying a load thereto. Thereafter, a load of 300 N, or a Hertz pressure of 310 MPa, was applied to the block-shaped test piece 20 from above. Then, the block-shaped test piece 20 was slid relatively on the ring-shaped test piece 21 by rotating the ring-shaped test piece 21 at a sliding speed of 0.3 m/sec. After sliding the block-shaped test piece 20 relatively on the ring-shaped test piece 21 for 30 minutes, the following friction/wear characteristics were measured: the friction coefficient between the block-shaped test piece 20 and the ring-shaped test piece 21; the maximum wear depth of the block-shaped test piece 20; and the wear width of the block-shaped test piece 20. Note that the "Hertz pressure" herein refers to the maximum value of actual pressure in which the elastic deformation of the contact between the block-shaped test piece 20 and the ring-shaped test piece 21 was taken into consideration.

Table 3 below summarizes the measurement results of the friction coefficients between the respective DLC-Si films and the ring-shaped test piece 21, and the maximum wear depths and wear widths for the respective DLC-Si films. Note that a block-shaped test piece itself, that is, the martensitic stainless steel SUS440C per se, on which no DLC-Si film was formed, was also subjected to the same ring-on-block wear test as described above. The results forth in the line of Table 3 identified with "SUS440C."

TABLE 3

| Sample No. | Film Thickness (μm) | Friction Coefficient | Wear Width (μm) | Maximum Wear Depth (μm) |
| --- | --- | --- | --- | --- |
| #1 | 3.0 | 0.09 | 230 | 0.2 |
| #3 | 3.0 | 0.08 | 160 | 0.1 |
| #5 | 11.4 | 0.09 | 180 | 0.05 |
| SUS440C | None | 0.12 | 450 | 1.2 |

As can be understood from Table 3, all of the block-shaped test pieces 20 exhibited improved wear resistance, compared with the disk-shaped test pieces 30 subjected to the above-described ball-on-disk wear test under nonlubricant condition. The advantage results from the fact that the degree of fluid lubrication was increased in the ring-on-block wear test carried out in the presence of the engine oil. In particular, the block-shaped test pieces 20 with DLC-Si films #3 and #5 formed showed higher wear resistance.

(3) Measurement of Internal Stress

DLC-Si films whose film compositions were the same as those of DLC-Si films #1 and #5 set forth in Table 1 above were formed on an Si wafer, respectively, in the same manner as described in above (1) (a). Internal stresses of the resulting DLC-Si films were calculated from warpage of the Si wafers according to the following equation.

Internal Stress={(Young's Modulus of Si Wafer)× (Thickness of Si Wafer)$^2$}/{(6×Poisson's Ratio of Si Wafer)×(Curvature Radius)×(Thickness of DLC-Si Film)

As a result, it was found out that DLC-Si film #1 exhibited an internal stress of 1.2 GPa, and DLC-Si film #5 exhibited an internal stress of 0.5 GPa. That is, DLC-Si film #5, which was formed using benzene and whose $Csp^2$ proportion was 75 atomic %, exhibited a smaller internal stress than DLC-Si film #1, which was formed using methane and whose $Csp^2$ proportion was 67 atomic %, did. Thus, it is understood that a greater $Csp^2$ proportion results in a smaller internal stress in DLC-Si film.

(4) DLC-Si Films #7 and #8

Moreover, except that a reaction gas which was free from methane and benzene but included toluene as set forth in Table 4 below was used, DLC-Si films were formed in the same manner as described above.

TABLE 4

| Sample No. | Reaction Gas (sccm) | | | | Film Composition (atomic %) | | | Proportion to Entire Carbon Content (atomic %) | |
|---|---|---|---|---|---|---|---|---|---|
| | TMS | Methane | Benzene | Toluene | Si | C | H | $Csp^2$ | $Csp^3$ |
| #7 | 2 | 0 | 0 | 10 | 6 | 68 | 26 | 73 | 27 |
| #8 | 2 | 0 | 0 | 20 | 2 | 73 | 25 | 76 | 24 |

The resulting DLC-Si films were labeled #7 and #8, respectively. DLC-Si films #7 and #8 were likewise subjected to the above-described ball-on-disk wear test and ring-on-disk wear test to examine the friction/wear characteristics. Tables 5 and 6 below summarize the examination results. Note that the present amorphous carbon film includes DLC-Si films #7 and #8.

TABLE 5

| Sample No. | Film Thickness (μm) | Friction Coefficient | Wear Width (μm) | Maximum Wear Depth (μm) |
|---|---|---|---|---|
| #7 | 3.2 | 0.07 | 380 | 0.2 |
| #8 | 4.2 | 0.19 | 330 | 0.15 |

TABLE 6

| Sample No. | Film Thickness (μm) | Friction Coefficient | Wear width (μm) | Maximum Wear depth (μm) |
|---|---|---|---|---|
| #7 | 3.2 | 0.09 | 206 | 0.15 |
| #8 | 4.2 | 0.09 | 190 | 0.1 |

It is appreciated from Tables 5 and 6 that DLC-Si film #7 and #8 exhibited similar friction/wear characteristics to those of DLC-Si films #2 through #6, that is, good sliding property as well as high wear resistance, even though the reaction gas did not include methane and benzene. Moreover, similarly to DLC-Si film #6, DLC-Si films #7 and #8 exhibited reduced maximum wear depths, despite comparatively large wear widths.

Having now fully described the present invention, it will be apparent to one of ordinary skill in the art that many changes and modifications can be made thereto without departing from the spirit or scope of the present invention as set forth herein including the appended claims.

The invention claimed is:

1. An amorphous carbon film, comprising:
    carbon as a major component, the carbon comprised of carbon having an $sp^2$ hybrid orbital in an amount of from 60 to 90 atomic % when the entire carbon amount is taken as 100 atomic %; and
    silicon in an amount of from 0.1 to 10 atomic % when the entire amorphous carbon film is taken as 100 atomic %.

2. The amorphous carbon film set forth in claim 1, further comprising hydrogen in an amount of from 10 to 30 atomic % when the entire amorphous carbon film is taken as 100 atomic %.

3. A process for forming the amorphous carbon film set forth in claim 1 on a surface of a substrate by means of plasma chemical vapor deposition, the process comprising:
    disposing a substrate in a reactor chamber;
    introducing a reaction gas into the reactor chamber,
        the reaction gas comprising:
            at least one member selected from the group consisting of hydrocarbon gases including carbon having an $sp^2$ hybrid orbital, and hydrocarbon gases decomposed by electric discharge to generate carbon having an $sp^2$ hybrid orbital; and
            a silicon compound gas; and
    electrically discharge the reaction gas.

4. The process set forth in claim 3, wherein the hydrocarbon gases having an $sp^2$ hybrid orbital comprise at least one member selected from the group consisting of benzene, toluene and naphthalene.

5. A high wear-resistant sliding member, comprising:
    a substrate; and
    the amorphous carbon film set forth in claim 1 formed on a part of a surface of the substrate at least.

6. The amorphous carbon film set forth in claim 1, wherein said amorphous carbon film is made by a process comprising:
    mixing gaseous compounds in a reaction vessel to form a reaction gas comprising a gaseous silicon compound and at least one hydrocarbon selected from the group consisting of a hydrocarbon gas including carbon having an $sp^2$ hybrid orbital, and hydrocarbon gases decomposed by electric discharge to generate carbon having an $sp^2$ hybrid orbital;
    electrically discharging said reaction gas to form ionized gas species; and
    depositing ionized gas species on a substrate by plasma CVD to form said amorphous carbon film.

7. The amorphous carbon film set forth in claim 6, wherein an input electric power of said depositing is at least 576 W.

8. The amorphous carbon film set forth in claim 6, wherein an input electric power of said depositing is 576 W.

9. The amorphous carbon film set forth in claim 6, wherein said amorphous carbon film is made by a process comprising:
    mixing gaseous compounds in a reaction vessel to form a reaction gas comprising a gaseous silicon compound and at least one hydrocarbon selected from the group consisting methane, propane, hexane, benzene, toluene, xylene, and naphthalene.

10. The amorphous carbon film set forth in claim 6, wherein said amorphous carbon film is made by a process comprising:
    mixing gaseous compounds in a reaction vessel to form a reaction gas comprising a gaseous silicon compound and at least one hydrocarbon selected from the group consisting, propane, hexane, benzene, toluene, xylene, and naphthalene.

11. The amorphous carbon film set forth in claim 10, wherein said reaction gas comprises a gaseous silicon compound and benzene.

12. The amorphous carbon film set forth in claim 10, wherein said reaction gas comprises TMS and benzene.

13. The amorphous carbon film set forth in claim 6, wherein said amorphous carbon film is made by a process comprising:
mixing gaseous compounds in a reaction vessel to form a reaction gas comprising a gaseous silicon compound and at least one hydrocarbon selected from the group consisting of benzene, toluene, xylene, and naphthalene.

14. The amorphous carbon film set forth in claim 1, wherein said carbon consists of carbon having an $sp^2$ hybrid orbital in an amount of from 60 to 90 atomic % when the entire carbon amount is taken as 100 atomic %, and the remainder of said carbon is carbon having an $sp^3$ hybrid orbital.

15. The amorphous carbon film set forth in claim 1, wherein said carbon is comprised of carbon having an $sp^2$ hybrid orbital in an amount of from 65 to 85 atomic % when the entire carbon amount is taken as 100 atomic %.

16. The amorphous carbon film set forth in claim 1, wherein said carbon is comprised of carbon having an $sp^2$ hybrid orbital in an amount of from 70 to 80 atomic % when the entire carbon amount is taken as 100 atomic %.

17. The amorphous carbon film set forth in claim 1, wherein said carbon is comprised of carbon having an $sp^3$ hybrid orbital in an amount of from 10 to 40 atomic % when the entire carbon amount is taken as 100 atomic %.

18. The amorphous carbon film set forth in claim 1, wherein said carbon is comprised of carbon having an $sp^3$ hybrid orbital in an amount of from 15 to 35 atomic % when the entire carbon amount is taken as 100 atomic %.

19. The amorphous carbon film set forth in claim 1, wherein said carbon is comprised of carbon having an $sp^3$ hybrid orbital in an amount of from 20 to 30 atomic % when the entire carbon amount is taken as 100 atomic %.

20. The amorphous carbon film set forth in claim 13, wherein said carbon is comprised of carbon having an $sp^2$ hybrid orbital in an amount of from 70 to 80 atomic % when the entire carbon amount is taken as 100 atomic %.

* * * * *